United States Patent [19]

Barringer et al.

[11] Patent Number: 4,835,039

[45] Date of Patent: May 30, 1989

[54] TUNGSTEN PASTE FOR CO-SINTERING WITH PURE ALUMINA AND METHOD FOR PRODUCING SAME

[75] Inventors: Eric A. Barringer, Waltham; Brian C. Foster, Sutton; James D. Hodge, Medway; Roger S. Lind, Acton, all of Mass.

[73] Assignee: Ceramics Process Systems Corporation, Cambridge, Mass.

[21] Appl. No.: 935,264

[22] Filed: Nov. 26, 1986

[51] Int. Cl.$^4$ .................. B32B 3/00; C03C 8/14; C03C 8/24; B22F 7/00

[52] U.S. Cl. .................. 428/210; 428/209; 428/428; 428/432; 428/901; 501/15; 501/17; 501/32; 106/1.05

[58] Field of Search .................. 501/15, 17, 32; 428/210, 428, 209, 432, 901; 106/1.05, 1.12

[56] References Cited

U.S. PATENT DOCUMENTS

| | | | |
|---|---|---|---|
| 3,993,821 | 11/1976 | Goss | 428/208 |
| 4,404,154 | 9/1983 | Arons et al. | 264/62 |
| 4,624,896 | 11/1986 | Watanabe et al. | 428/428 |
| 4,678,683 | 7/1987 | Pasco et al. | 501/96 |
| 4,734,233 | 3/1988 | Toda et al. | 428/210 |

FOREIGN PATENT DOCUMENTS

| | | |
|---|---|---|
| 0230675 | 8/1987 | European Pat. Off. |
| 0980975 | 1/1965 | United Kingdom |
| 1017487 | 1/1966 | United Kingdom |

OTHER PUBLICATIONS

Chem. Abs.: 104: 173209u (1986).
Chem. Abs.: 94: 196539r (1981).

Primary Examiner—Ellis P. Robinson
Assistant Examiner—P. J. Ryan
Attorney, Agent, or Firm—Bradley N. Ruben

[57] ABSTRACT

A tungsten paste suitable for co-sintering with 98+% alumina substrate can be produced by adding selected compositions of glass to the paste. Circuit packages produced in accordance with the present invention exhibit superior thermal conductivity, low shrinkage variability, and smoother and more homogeneous surface finish. A preferred embodiment of the invention utilizes a substrate comprising narrow size range alumina powder, thus yielding lower sintering temperature and further improvements in shrinkage variability and surface finish.

12 Claims, No Drawings

TUNGSTEN PASTE FOR CO-SINTERING WITH PURE ALUMINA AND METHOD FOR PRODUCING SAME

DESCRIPTION

This invention relates to ceramic packages for integrated circuits, and in particular, to compositions of tungsten paste which can be co-sintered with high alumina content powder to produce integrated circuit packages.

BACKGROUND ART

Ceramics have found widespread use in electronics as a substrate for integrated circuit packages. Metallized circuit patterns are applied to the ceramic substrate, and ceramic and metallization are co-sintered to create a monolith of substrate and circuitry. Multi-layer circuit packages are constructed by combining ceramic particles and organic binder unto unfired, or "green," tape. Inter-layer conductive paths, known as "vias," are then inserted through the layers, forming electrical interconnections between the circuits on each layer after they are stacked and processed. Thereafter, metallized circuit patterns are applied. The tape layers typically have thicknesses ranging from 5 to 25 mils. Holes and notches are formed in the layers as required. Multiple layers of printed tape are stacked and then laminated under pressure, and ceramic and metallization co-sintered to form a monolithic structure with three-dimensional circuitry.

Typically, substrates are formed from a combination of approximately 90-94% commercial alumina, and 6-10% silicon-based glass, and tungsten or molybdenum/manganese paste is used to form the metallized conductive paths. The glass is added to the alumina to promote bonding of the tungsten to the alumina and to provide sintering of the alumina at a lower temperature than for 98+% commercial alumina. In prior art 100% tungsten paste formulations, the glass component is used in the alumina substrate to facilitate adhesion of the tungsten and alumina particles. Upon firing, the glass component migrates into the tungsten layer, providing interface adhesion between the paste component and substrate. Circuit packages produced from this prior art formulation display a dielectric constant of approximately 9-9.5, thermal conductivity of approximately 0.045(cal cm/cm$^2$ sec C.°) at 20° C. (compared with 0.85(cal cm/cm$^2$ sec C.°) for 99.5% aluminal), shrinkage variability of 0.5% -1.0%, and a surface finish of greater than 25 microinches. While these substrate properties may have been acceptable for conventional semiconductor packages, they are inadequate for high-performance large scale integration circuitry.

Surface finish becomes increasingly important as the size of circuit features such as pads and vias decreases. In microelectronic circuits produced by thin-film metallization techniques, the conductor thickness can be as small as a few microns (1 micron=40 microinches), so that if the substrate has a 25 microinches surface finish typical of the prior art, the conductor path will have substantial differences in thickness along its length, or may even be discontinuous, with a corresponding deterioration in function. Accordingly, roughness of surface finish prevents post-firing circuit personalization by thin-film metallization.

Moreover, porosity of the as-fired surface, especially when combined with roughness of the surface, leads to the problem of retention of plating salts. Aggressive cleaning procedures are required to avoid deposition of plating where not desired, and to avoid blistering upon firing. Greater smoothness and lack of porosity would allow the use of more active catalysts, which, in turn would increase product yield through electroless plating operations.

Reduction in shrinkage variability is also especially important as feature size decreases, and a reduction in shrinkage variability from the prior art 0.5-1% level would increase yield. This is because variability in shrinkage prevents precise location of integrated circuit pads, vias, and other device interconnects and increases the probability of discontinuities necessitating discarding of the product. The need for reduction in shrinkage variability extends to both the manufacturer of substrates and the substrate consumer, who requires precise positioning of devices and interconnects and, in a few special cases, reliable circuit personalization by thin-film metallization.

Accordingly, there exists a need for a substrate/metallization system with greater thermal conductivity, lower shrinkage variability, and better surface finish, while maintaining the desired dielectric and electrical properties.

DISCLOSURE OF INVENTION

We have discovered that circuit packages can be produced by using a 98+% alumina substrate in conjunction with a tungsten paste to which selected compositions of glass have been added. Circuit packages produced in accordance with the present invention exhibit superior thermal conductivity, low shrinkage variability, and smoother and more homogeneous surface finish. By employing narrow size range alumina powder, shrinkage and surface finish parameters are still further improved, and sintering temperature is reduced. Further details and embodiments of the invention are described below.

DESCRIPTION OF SPECIFIC EMBODIMENTS

We have found that a tungsten paste suitable for co-sintering with 98+% alumina can be produced by adding a selected composition of glass to the tungsten paste. A preferred embodiment of the invention utilizes narrow size range alumina powder having a mean particle size in the range of approximately 0.3 to 1.0 micrometers with a standard deviation approximately 50% of mean. The use of narrow size range alumina particles allows sintering at low temperatures, typically 1500°-1550° C., compared with 1600°-1700° C. for wide size range alumina particles typical of commercially available powders. Moreover, this lower sintering temperature for narrow size range alumina is achieved without the necessity of adding glass to the alumina, with its concomitant decrease in thermal conductivity. We have found that 98+% alumina exhibits substantially higher thermal conductivity than does 90% alumina, regardless of particle size. The respective thermal conductivities of 92% and 99.5% alumina at 20° C. are 0.045 and 0.085 (cal cm/cm$^2$ sec C.°) Using narrow size range alumina particles also permits more uniform green densities, and in a 98+% ratio, produces a fired ceramic having an excellent surface finish suitable for thin film deposition. In contrast, typical prior art substrates produced from wide size range 90-94% alumina and 6-10% glas require polishing for thin film applications, which increases cost and creates voids.

The use of 98+% $Al_2O_3$ substrate precludes the use of the tungsten metallization common with the prior art, which typically consists of organic solvent, polymeric binder, and tungsten powder. Instead, a preferred embodiment of the invention for surface metallization generally involves the steps of mixing tungsten particles having an average particle size of approximately 0.5–2.0 microns with an ethyl cellulose solution, and adding to the mixture alkaline earth aluminosilicate powder having selected ratios of one or more of the following: $CaO$, $BaO$, $MgO$, $Al_2O_3$, and $SiO_2$. Preferably the weight ratios of the components of the glass are as follows: alkaline earth 10–38%, alumina 10–52%, and silca 10–70%, altough other ratios are possible. Upon firing, the glass flows into the alumina body thereby creating a bond phase. In particular, it is desirable that the glass remain in the region of the interface between the tungsten and the alumina; if the glass migrates more generally into the substrate, bonding of the tungsten may be adversely affected. The composition and ratios of the glass component are tailored to adjust the melting point and viscosity characteristics of the glass to maximize metallization adherence to ceramic. Typically, approximately 5 to 35 volume percent glass appears in the fired metallization. It is possible, however, to utilize proportions of glass outside of this range. The resulting mixture is milled and applied in a thin layer to a green tape of 98+% narrow size range alumina particles. This tape is further discussed in our copending application serial no. U.S. Pat. No. 4,769,294 which is hereby incorporated herein by reference. Generally, that patent describes an alumina substrate fabricated from a narrow size range alumina powder having a mean particle size in the range of 0.3 to 1.0 micrometer with a standard deviation not greater than aproximately 50% of the mean.

In formulations for via fill in accordance with the present invention, one may typically employ tungsten particles ranging in size from 0.5 to 4.0 microns with an ethyl cellulose polyvinylbutyral solution, and add to the mixture an alkaline earth alumino silicate powder (as defined above). In addition, alumina and zirconia can be added to adjust the shrinkage and thermal expansion properties of the metallizaiton. Typically, for via fill applications, the fired metallization may include 40 to 70 volume percent tungsten, 25 to 10 volume percent aluminosilicate glass, and 50 to 20 volume percent alumina and/or zirconia.

In the case of either via fills or surface metallization, the tape/paste composite is then fired at between 1450° and 1550° C. in an atmosphere of dissociated ammonia and nitrogen (50% $H_2$ and 50% $N_2$) and water vapor at a dew point ranging from 15°–45° C. Alternatively, multiple layers of paste and alumina substrate can be laminated and co-sintered to form a ceramic monolith with a three dimensional conductor system.

Tungsten sintering aids known in the art, such as nickel, cobalt, palladium, niobium, yttrium, manganese, and titania, may be added. Typically, approximately .02 weight percent cobalt or palladium, or 0.02–0.10 weight precent nickel are employed. These metal dopants form an active liquid phase to facilitate sintering. Additionally, sintering may be enhanced by using finer particle sizes and by pre-reducing the tungsten powder (removing the oxide component) prior to producing the paste mixture. Improved sintering provides greater hermeticity, that is, the sealing of gases from the alumina body and greater metallization bond strength.

It will be appreciated that the present invention may be employed with molybdenum in lieu of tungsten, co-sintered at a lower temperature than typically used with prior art formulations. The paste formulations in accordance with the present invention may also be suitable for co-firing and/or for post-firing applications. It will be appreciated futhermore that the invention may be utilized in connection with substrates other than alumina, which have sintering temperatures ranging from 1450°–1550° C. for co-firing and as high as 1600° C. for post-firing. Such substrates may include, for example, beryllia, zirconia, alumina-based composites, aluminum nitride, and silicon nitride. It will additionally be appreciated that glasses other than alkaline earth alumino silicates may be satisfactorily employed in paste formulations in accordance with the present invention, the principal criteria being that in firing, the glass wets both the metal and the cermaic substrate and does not adversely react with these materials. Other suitable glasses may include aluminates.

The following examples are illustrative of the invention:

EXAMPLE 1

67 parts by weight of tungsten powder having an average particle size of 1–2 micrometers and 33 parts by weight of an 8% ethyl cellulose solution were mixed. To this mixture a $MgO/Al_2O_3/SiO_2$ powder of the composition 14.0% $MgO$, 33.7% $Al_2O_3$, 52.3% $SiO_2$ was added in the amount of 37% by volume, based on the amount of tungsten in the mixture. This mixture was blended in a ceramic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C. dewpoint. Measured bulk resistivities for 10 and 20 mil line width surface traces were 0.010 milliohms/in.

EXAMPLE 2

67 part by weight of tungsten powder having an average particle size of 1–2 microns and 33 parts by weight of an 8% ethyl cellulose solution were mixed. To this mixture a $MgO/Al_2O_3/SiO_2$ powder of the composition 16.3% $MgO$, 29.1 % $Al_2O_3$, 54.6% $SiO_2$ was added in the amount of 37% by volume, based on the amount of tungsten in the mixture. This mixture was blended in a ceramic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C. dewpoint. Measured bulk resistivities for 10 and 20 mil line width surface traces were 0.010 milliohms/in

EXAMPLE 3

67 parts by weight of tungsten powder having an average particle size of 1–2 micrometers and 33 parts by weight of an 8% ethyl cellulose solution were mixed. To this mixture a $MgO/Al_2O_3/SiO_2$ powder of the composition 16.3% $MgO$, 29.1% $Al_2O_3$, 54.6% $SiO_2$ was added in the amount of 15% by volume, based on the amount of tungsten in the mixture. Following this addition 0.02% by weight of Ni dissolved in 25 ml. of HNO₃ was added to the mixture. This mixture was blended in a cermaic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C. dewpoint. Measured bulk resistivities for 10 and 20 mil line width surface traces were .010 milliohms/in.

EXAMPLE 4

65 parts by weight of a W powder having an average particle size of 1–2 microns and 35 parts by weight of an 8% ethyl cellulose solution were mixed. To this mixture a $CaO/Al_2O_3/SiO_2$ powder of the composition 29.3% CaO, 39.0% $Al_2O_3$, 31.7% $SiO_2$ was added in the amount of 35% by volume, based on the amount of W in the mixture. This mixture was blended in a cermaic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C.

EXAMPLE 5

65 parts by weight of a W powder having an average particle size of 1–2 microns and 35 parts by weight of an 8% ethyl cellulose solution were mixed. To this mixture a $CaO/Al_2O_3/SiO_2$ powder of the composition 37.7% CaO, 52.3% $Al_2O_3$ 10.0% $SiO_2$ was added in the amount of 35% by volume, based on the amount of W in the mixture. This mixture was blended in a ceramic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C. dewpoint.

EXAMPLE 6

65 parts by weight of a W powder having an average particle size of 1–2 microns and 35 parts by weight of an ethyl cellulose solution were mixed. To this mixture a $CaO/MgO/Al_2O_3/SiO_2$ powder of the composition 15.2% CaO, 8.6% MgO, 16.6% $Al_2O_3$, 59.6% $SiO_2$ was added in the amount of 35% by volume, based on the amount of W in the mixture. This mixture was blended in a ceramic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmospher with a 34° C. dewpoint.

EXAMPLE 7

64 parts by weight of a metal/ceramic composite was mixed with 36 parts by weight of an organic vehicle. The composite consisted of 36.8 volume percent W, 29.4 volume percent $Al_2O_3$, 26.4 volume percent $SiO_2$, and 7.4 volume percent $CaO/Al_2O_3/SiO_2$ of the composition 23.1 weight percent CaO, 41.2 weight percent $Al_2O_3$, 35.7 weight percent $SiO_2$. The organic vehicle was comprised of 10 parts by weight ethyl cellulose, 4 parts by weight of a wetting agent and 86 parts by weight of solvent. This mixture was blended in a ceramic mill jar filled with tungsten carbide shot for 2 hours. The mixture was then subjected to 3 passes through a 3 roll ink mill using 1.5 mil roller spacing. Samples were screen printed on 99+% alumina green tape and fired at 1475°–1550° C. peak temperatures for 2 hours in a 50:50 $H_2/N_2$ atmosphere with a 34° C. dewpoint.

What is claimed is:

1. An as-fired substrate-based circuit package, comprising:
   a substrate selected from the group consisting of those derived from (i) at least 98% alumina, (ii) beryllia, (iii) zirconia, (iv) aluminum nitride, and (v) silicon nitride; and
   a conductive layer including at least one metal selected from the group consisting of tungsten and molybdenum, and between approximately 5 and 35 volume percent of a glass that wets both the substrate and the selected metal at the substrate sintering temperature, the glass comprising the glass comprising 10–38 weight % alkaline earth oxide, 10–52 weight alumina and 10–70 weight % silica.

2. A package according to claim 1, wherein the substrate is at least 98% alumina.

3. A package according to claim 2, wherein the substrate is at least 98% alumina and is derived from alumina particles characterized by having a mean particle size in the range of 0.3 to 1.0 micrometer with a standard deviation not greater than approximately 50% of the mean.

4. An as-fired substrate based circuit package as set forth in claim 1 in which the alkaline earth oxide in MgO present in the range of 8.6–16.3 weight %.

5. An as-fired substrate based circuit package as set forth in claim 1 in which the alkaline earth oxide is CaO present in the range of 15.2–37.7 weight %.

6. An as-fired substrate based circuit package as set forth in claim 1 in which the alumina is present in the range pf 16.6–39 weight %.

7. An as-fired substrate based circuit package as set forth in claim 23 in which the alumina is present in the range of 29–39 weight %.

8. An as-fired substrate based circuit package as set forth in claim 11 in which the silica is present in the range of 10–55 weight %.

9. An as-fired substrate based circuit package as set forth in claim 8 in which the silica is present in the range of 10–32 weight %.

10. An as-fired substrate based circuit package as set forth in claim 1 in which the glass is present in the range of 5–15 volume %.

11. An as-fired substrate-based circuit package, comprising:
   a substrate selected from the group consisting of those derived from (i) at least 98% alumina, (ii) beryllia, (iii) zirconia, (iv) aluminum nitride, and (v) silicon nitride; and vias formed in said substrate; and vias filled with a conductive material comprising 40–70 volume % tungsten, 10–25 volume % aluminosilicate glass and 20 to 50 volume % of a material selected from alumina, zirconia or mixture thereof.

12. An as-fired substrate based circuit package as set forth in claim 1 which further includes a sintering aid selected from the group consisting of nickel, cobalt, palladium, niobium, yttrium, manganese and titania present in the range of 0.02–0.10 weight percent.

* * * * *